(12) United States Patent
Pille et al.

(10) Patent No.: US 7,813,163 B2
(45) Date of Patent: Oct. 12, 2010

(54) SINGLE-ENDED READ AND DIFFERENTIAL WRITE SCHEME

(75) Inventors: Juergen Pille, Stuttgart (DE); Otto Wagner, Altdorf (DE); Sebastian Ehrenreich, Schoenau (DE); Rolf Sautter, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 12/190,680

(22) Filed: Aug. 13, 2008

(65) Prior Publication Data

US 2009/0059688 A1 Mar. 5, 2009

(30) Foreign Application Priority Data

Sep. 5, 2007 (EP) .................................. 07115713

(51) Int. Cl.
*G11C 11/00* (2006.01)
(52) U.S. Cl. ............... 365/154; 365/189.14; 365/230.05
(58) Field of Classification Search ............ 365/230.05, 365/154, 156, 205, 168
See application file for complete search history.

(56) References Cited

U.S. PATENT DOCUMENTS

| 5,742,557 | A  | * | 4/1998  | Gibbins et al. ......... 365/230.05 |
| 7,504,695 | B2 | * | 3/2009  | Martelloni et al. .......... 257/368 |
| 7,626,851 | B2 |   | 12/2009 | Behrends |
| 7,675,794 | B2 |   | 3/2010  | Behrends |
| 2005/0281109 | A1 | * | 12/2005 | Martelloni et al. .......... 365/206 |

* cited by examiner

*Primary Examiner*—Gene N. Auduong
(74) *Attorney, Agent, or Firm*—Mark E. McBurney; Adam Steadman

(57) ABSTRACT

A method to read and write at least one static memory cell is provided, said cell comprising a cross-coupled inverter pair and two pass-devices wherein said method is characterized in that during read only one of the two pass-devices is selected, while for write both pass-devices are selected. Furthermore, a circuit to read and write at least one static memory cell is described, said cell comprising a cross-coupled inverter pair and two pass-devices. Said circuit is characterized in that for each pass-device of the cell an individual wordline is connected with a gate of the particular pass-device, wherein both wordlines are selected for write and a single wordline is selected for read.

11 Claims, 4 Drawing Sheets

(State of the Art)

SINGLE-ENDED READ AND DIFFERENTIAL WRITE SCHEME

CROSS-REFERENCE TO RELATED APPLICATIONS

This application claims priority under 35 U.S.C. §119 to European Patent Application No. 07115713.5 filed Sep. 5, 2007, the entire text of which is specifically incorporated by reference herein.

BACKGROUND OF THE INVENTION

The present invention relates to read and write schemes for use in items such as Static Random Access Memory (SRAM) arrays and register files.

Power consumption in highly integrated silicon chips has become increasingly important. Memory elements are a significant contributor to power consumption due to their size and the area that they occupy. The present invention proposes a new read and write scheme that lowers read power significantly in single-ended memory type read schemes, which are used in items such as SRAM arrays and register files.

A typical static memory cell, a SRAM cell 01, is shown in FIG. 1 and consists of a cross-coupled inverter pair 02 and two read/write- or pass-devices 03 (hereinafter "pass-devices"), one on each side. The cell 01 is differentially written through the two pass-devices 03 by applying a differential signal at two bitlines true (blt) 04 and complement (blc) 05. For example, when writing a '1', blt 04 is high while blc 05 is low. This guarantees a robust functionality across a wide process window and mismatches between the devices 03, 06 within the same cell 01. Both pass-devices 03 are connected to the same wordline 07 signal wl, which selects the cell 01 for writing.

For read, two schemes have been established: Differential sense-amp read schemes and single-ended read schemes (e.g., single-ended ripple-domino read schemes).

Differential sense-amp read schemes precharge both bitlines 04, 05 to the same high logic voltage Vdd and select the cell 01 through the same wordline 07. Then, the cell 01 discharges one of the two bitlines 04 and 05 depending on its content while keeping the other side high. Subsequently, a sense-amp circuit detects the voltage difference between the two signals (i.e., bitlines 04, 05) and latches its value. These schemes rely on a differential bitline signal for read and/or write.

From Ryuhei Sasagawa et al. 'High-speed Cascode Sensing Scheme for 1.0 V Contact Programming Mask Rom', 1999 Symposium on VLSI Circuits, Digest of Technical Papers, pps 95-96, and from Kenichi Imamiya et al, 'A 68-ns 4-Mbit CMOS EPROM with High-Noise-Immunity Design', 1990, IEEE Journal of Solid State Circuits Vol. 25, Issue 1, pps. 72-78, single-ended read schemes are known.

In a single-ended read scheme, such as a single-ended ripple-domino read scheme, only one of the two bitlines 04, 05 is actually used for the read. After the cell 01 is selected by the wordline 07, the cell 01 either holds or discharges the bitlines 04, 05. A receiver circuit is switched after the bitline level drops below a certain level. The advantage of this scheme is that it is more robust against process variations seen in current and future technologies such as 90 nm and beyond.

From a power perspective, in read mode both of the bitlines 04, 05 are always precharged to a high voltage level before the cell 01 is selected. Then, one of the two bitlines 04, 05 is pulled down. The power consumption is always the same, regardless of whether the cell 01 holds a 'one' or a 'zero' and even if only one side is used for read.

SUMMARY OF THE INVENTION

An improved method is provided for reading and writing at least one static memory cell in order to reduce power consumption, plus a circuit reducing power consumption by allowing execution of such method to read and write at least one static memory cell.

A first exemplary embodiment concerns a method to read and write at least one static memory cell with a single-ended read scheme, the cell comprising a cross-coupled inverter pair and two pass-devices, one on each side of the cross-coupled inverter pair. Using the method, during a single-ended read scheme, for read only one of the two pass-devices is selected, while for write both pass-devices are selected for a robust write function. This method has the advantage over the state of the art in that it provides a single-ended read and differential write scheme which reduces power consumption when applied on a static memory cell.

According to a preferred embodiment of said method, for each pass-device of the cell, an individual wordline is connected with a gate of the particular pass-device, wherein both wordlines are selected and driven high for write, so that the cell still can be differentially written, in order to select both pass-devices for write, and only a single wordline is selected and driven high for read in order to select only one of the two pass-devices during read. As a result, during read the wordline load is reduced significantly, since only half of the pass-devices are connected, resulting in a significant reduction of the power consumption.

In another exemplary embodiment of said method, the said wordline selected and driven high for read is the wordline selecting the pass-device connected to the bitline that is used in a single-ended read scheme, wherein if the cell during read holds a one, the bitline is pulled down, but if the cell holds a zero, no discharge of the bitline occurs. If the cell holds a zero, no discharge of the bitline occurs, and thus no power is consumed. Since statistically about 60% of all cells contain a zero, this directly results in a 60% power reduction on the bitlines during read. Since read is the dominant mode of a typical array, the bitline power savings can be significant: up to 50%.

In a particularly preferred embodiment of said method, an array read/write signal is used in order to select only one of the two pass-devices during read and in order to select both pass-devices during write. More specifically, the array read/write signal controls whether the cell is to be accessed in read mode or write mode and thus is used to select whether only one wordline is selected and driven high (for read) or both wordlines are selected and driven high (for write).

A second exemplary embodiment concerns a circuit to read and write at least one static memory cell comprising a cross-coupled inverter pair and two pass-devices, one on each side of the cross-coupled inverter pair. Said circuit comprises an individual wordline for each pass-device of the cell. Each wordline is connected with a gate of the particular pass-device, wherein both wordlines are selected for write and only a single wordline is selected for read.

Said circuit has an advantage over the state of the art in that it implements a single-ended read scheme and differential write scheme according to the method described above. This provides all the advantages of the method Embodiments described herein.

According to a preferred embodiment, said circuit comprises a separate wordline driver for each wordline driving a single cell pass-device and a control feature to select one wordline or both wordlines, depending on whether the cell is to be accessed in read or write mode.

In a preferred embodiment of said circuit, the control feature uses an array read/write signal, which controls if the cell is to be accessed in read or write mode, in order to select one wordline or both wordlines. Thereby, the array read/write signal can be either externally supplied by a controlling logic or internally generated based on its pre-set mode.

In another preferred embodiment of said circuit, the separate wordline driver for each wordline driving a single cell pass-device and/or the control feature is included for at least two cells of a memory array.

BRIEF DESCRIPTION OF THE DRAWINGS

The foregoing, together with other objects, features, and advantages of this invention can be better appreciated with reference to the following specification, claims and drawings, where

DETAILED DESCRIPTION

A fundamental idea of one exemplary embodiment of the invention is that in the single-ended sense scheme, during read only one of the two pass-devices is selected, while during write both pass-devices are selected for a robust write function.

Figure 1:
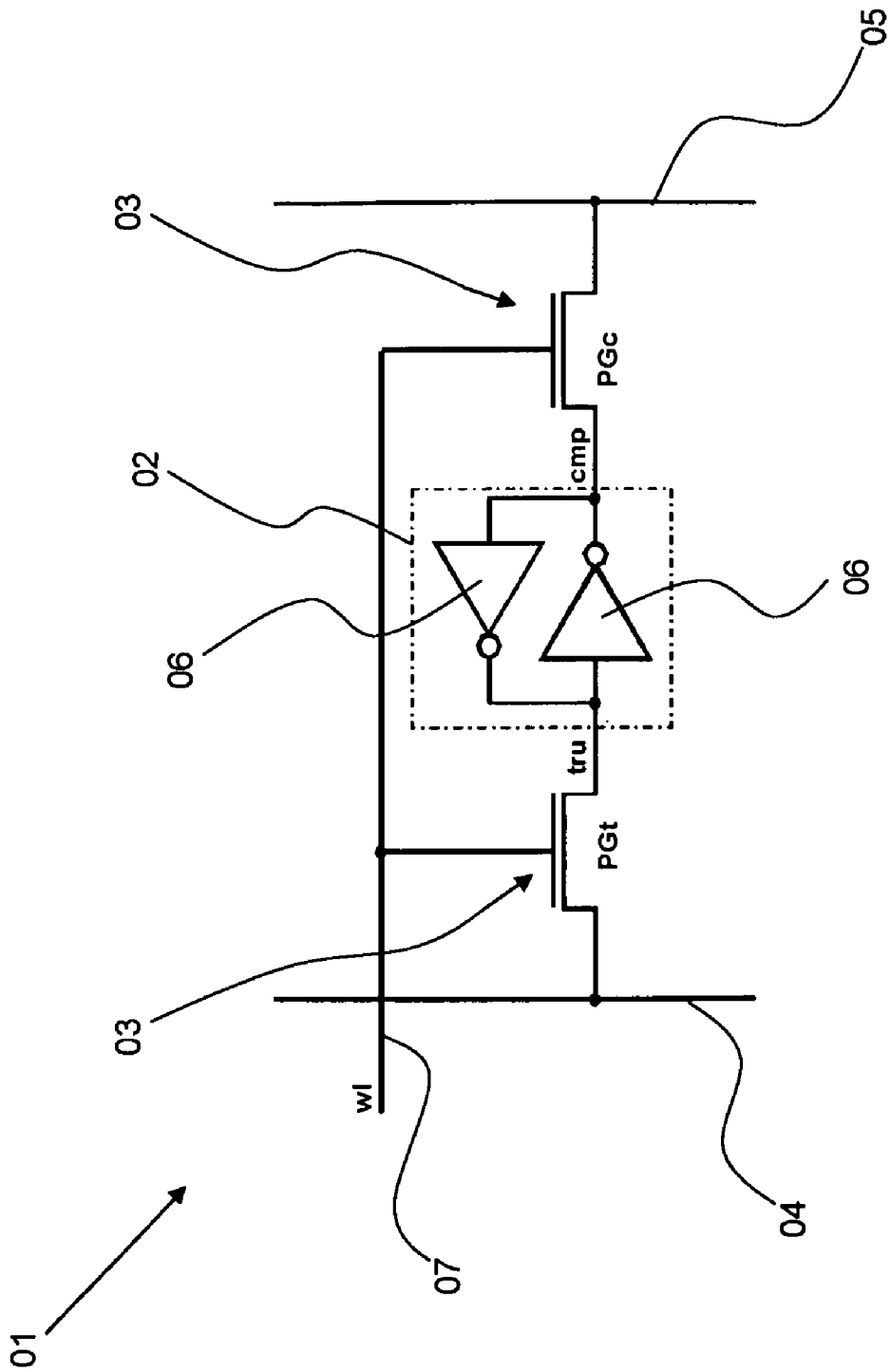
FIG. 1 is showing a schematic diagram of a standard six-device SRAM cell according to the state of the art.
Figure 2:
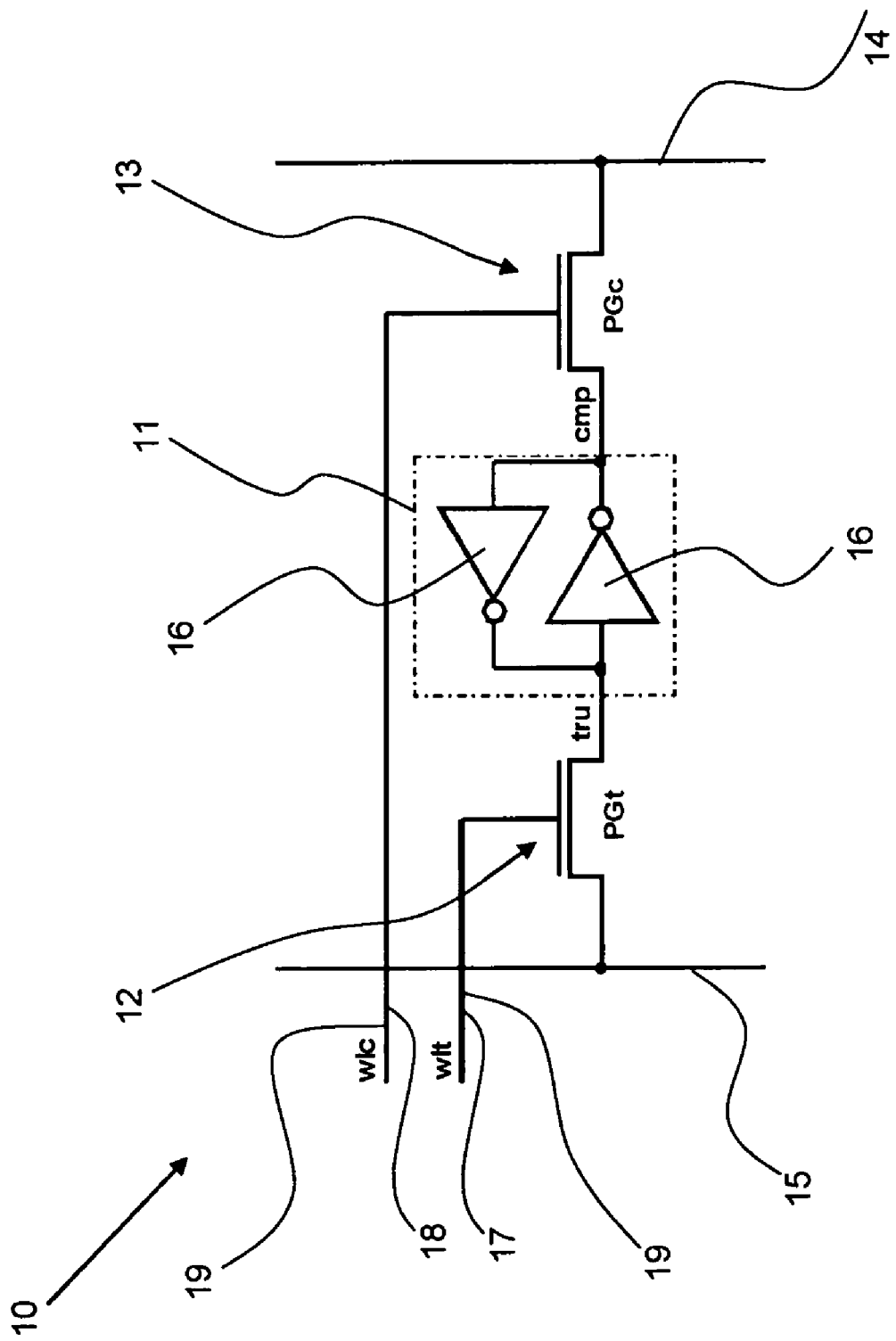
FIG. 2 is showing a schematic diagram of a six-device SRAM cell with split read and write wordlines according to the one exemplary embodiment.

To implement this fundamental idea, a static memory cell 10 (specifically, a SRAM cell) with a single-ended read scheme is shown in FIG. 2 and comprises a cross-coupled inverter 16 pair 11 and two pass-devices 12, 13, one on each side. The cell 10 further comprises two bitlines: A bitline true blt 15 and a bitline complement blc 14. In contrast to the state of the art cell 01 shown in FIG. 1, the wordline 07 is split into two wordlines 17, 18, each connected with a gate of only one of the two pass-devices 12, 13. The wordlines 17, 18 are part of a circuit 40 (FIG. 4) to read and write at least one static memory cell 10.

During write, both wordlines 17, 18 are selected and driven high, and thus both the pass-devices 12 and 13 are selected, so that the cell 10 still can be differentially written. During read, only wordline 18 is driven high, selecting the pass-device 13 that is connected to the bitline 14 that is used in a single-ended read scheme. If the cell 10 now contains a one, the bitline 14 is pulled down, but if the cell holds a zero, no discharge of the bitline 14 occurs (FIG. 2). In the latter scenario, no power is consumed. Since statistically about 60% of all cells contain a zero, this directly results in a 60% power reduction on the bitlines 14, 15 (FIG. 2) compared to the bitlines 04, 05 (FIG. 1) during read. Moreover, the wordline load is reduced significantly, since only half of the pass-devices 12, 13 are connected, further reducing the power consumption. Since read is the dominant mode of a typical array, the bitline power savings can be significant: up to 50%. Power consumption in write mode is unchanged with this scheme.

As referred to above, in contrast to the state of the art shown in FIG. 1, the wordline 07 is split into two independent wordlines 17, 18, each one connected to one of the pass-devices 12, 13, wherein both wordlines 17, 18 are selected for write and only a single wordline 18 is selected for read.

Figure 4:
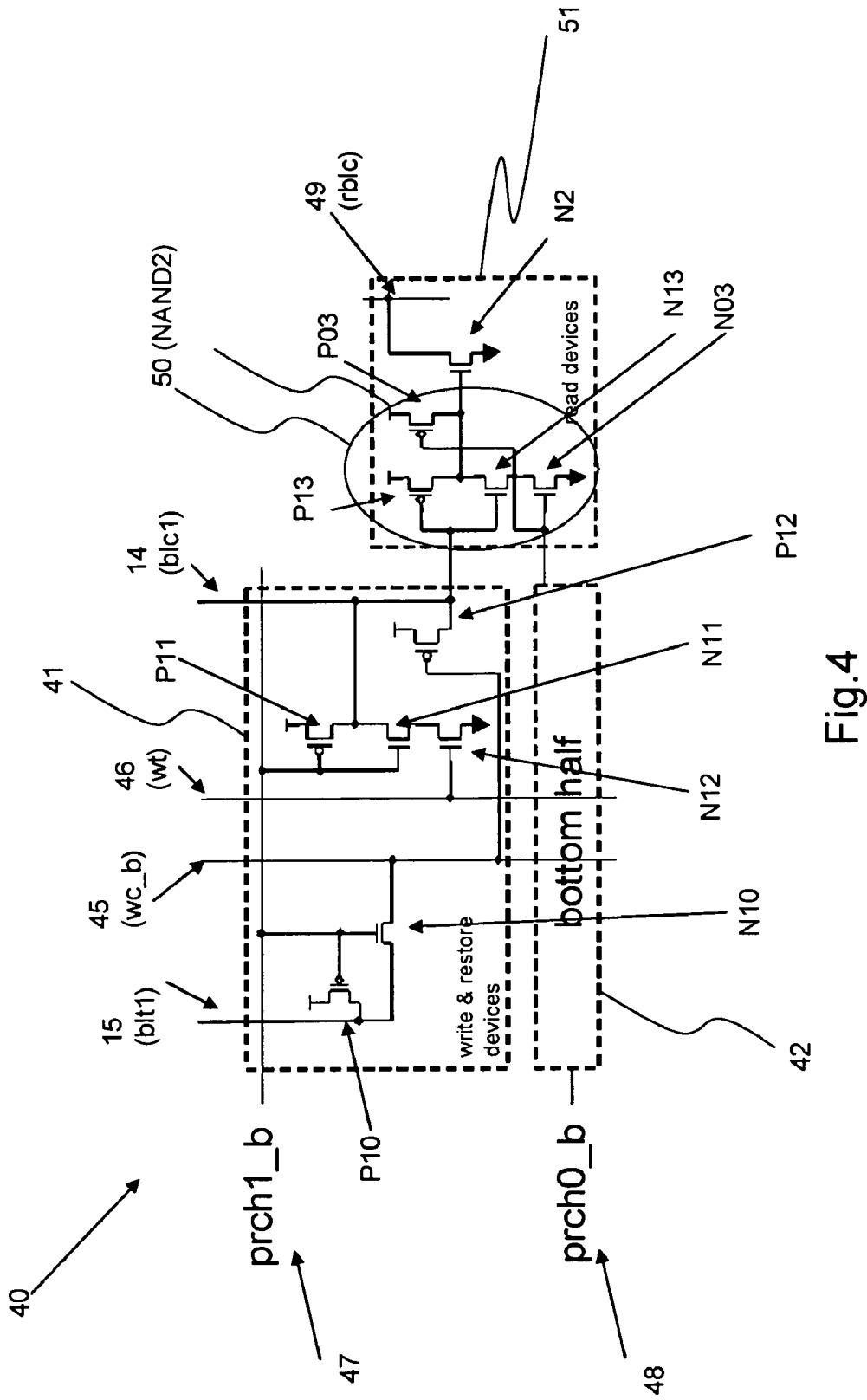
FIG. 4 is showing a circuit implementing a single-ended read and differential write scheme according to one exemplary embodiment.

Besides splitting the wordline itself, a separate wordline driver for each signal is needed. Moreover, a control feature is needed to select one or both signals, depending on the mode. The array read/write signal, which controls the mode, is such a control feature An exemplary circuit 40 to read and write at least one static memory cell 10 is shown in FIG. 4. However, other circuits can be devised.

FIG. 4 shows a circuit 40 for reading and writing at least one static memory cell 10, with cell 10 comprising a cross-coupled inverter 16 pair 11 and two pass-devices 12, 13, one on each side of the cross-coupled inverter 16 pair 11 (FIG. 2). The circuit 40 implements a single-ended read and differential write scheme.

The read/write circuit 40 of FIG. 4 consists of two blocks 41, 42: a first block 41 including the write and restore devices for a group of cells at the top, and a second block 42 including the write and restore devices for a group of cells at the bottom. These two blocks 41, 42 are fully symmetrical and can be independently controlled through two precharge signals prch1_b 47, prch0_b 48, only one of which can be selected at a given time. The precharge signal prch1_b 47 restores local bitlines blt1 15, blc1 14 (belonging to a first group of cells at the top) to the supply voltage through devices P10 and P11 and also triggers the read/write access, timed synchronous to the wordline. Two global write bitlines wc_b 45 and wt 46 are used to switch between read and write.

The read/write circuit 40 further consists of a block 51 including the read device, which connects the two bitlines of the top and bottom group with a two-input NAND stage 50, and a global bitline rblc 49 pulldown device N2.

When writing a '1' to the top group of cells by setting the precharge signal prch1_b 47 to prch1_b=1, the global write bitline wc_b 45 to wc_b=1, and the global write bitline wt 46 to wt=1, the complement bitline blc1 14 is pulled down by the write devices N11, N12, while the true bitline blt1 15 is held high by device N10. The PMOS device P12 is turned off. When writing a '0' by setting the precharge signal prch1_b 47 to prch1_b=1, the global write bitline wc_b 45 to wc_b=0, and the global write bitline wt 46 to wt=0, the bitline blt1 15 is driven low by device N10. The bitline blc1 14 is held high through the PMOS hold device P12 to mask any false switching on the local bitline blc0 to the global read bitline rblc 49.

During read, the write devices are inactivated by setting the global write bitline wc_b 45 to wc_b=1 and the global write bitline wt 46 to wt=0. When reading a '1' from the top group of cells, the precharge signal prch1_b 47 goes high, the selected cell pulls down the bitline blc1 14, and the down level passes through the two-input NAND 50 (consisting of P03, P13, N03, N13) and pulls up the gate of the global read device N2. When reading a '0', the bitline blc1 14 is held high by the selected cell fighting the leakage of the other cells connected to the bitline. The bitline settles a Vt below cell supply voltage, so the NAND 50 switching point must be below that level.

Figure 3:
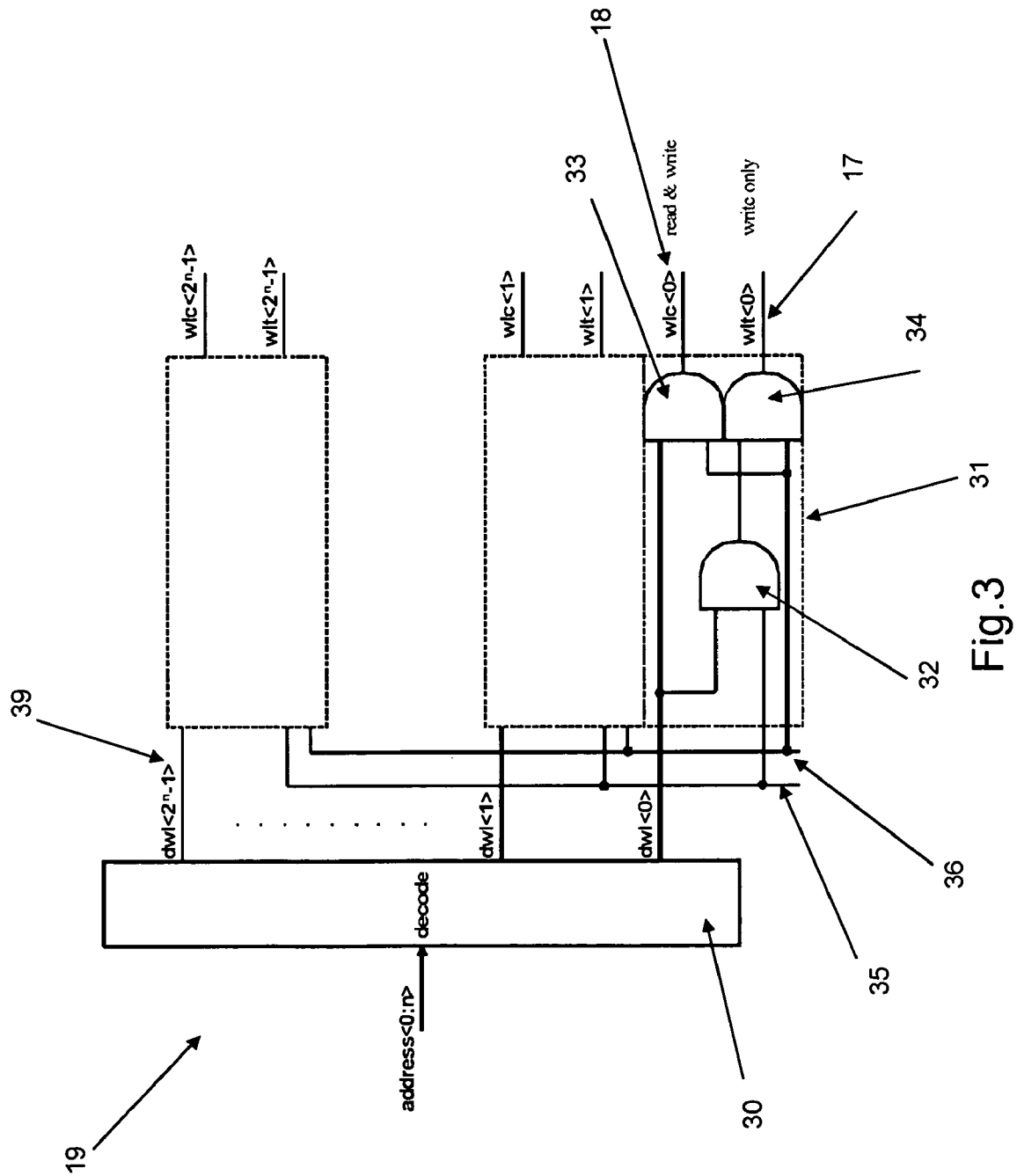
FIG. 3 is showing an address control block logical decode scheme with split read and write wordline drivers according to one exemplary embodiment.

An address control block 19 shown in FIG. 3 consists of two major blocks: the actual decode block 30, which translates an address vector <0:n> into $2^n$ pre-wordlines dwl 39, and a block 31 to control the read and write wordline selection as a control feature 31. The actual wordline drivers are 33 and 34, which drive the wordlines 18 (for read and write) and 17 (for write only) respectively. A clock signal 36 is connected to each wordline driver 33, 34 and triggers the wordlines 17, 18 for read and write. The read/write select signal is connected via a logical 'and' 32 to the wordline driver 34. At any given combination of an address, only one pre-wordline dwl 39 is selected. This signal is directly connected to wordline driver 33, but it is connected to the wordline driver 34 only through the logical "and" 32. During read, read/write signal 35 is low, and therefore the input to the wordline driver 34 is low. Accordingly, with the next clock cycle, clock signal 36 goes high, and only the read wordline 18 of the selected block 31 will go active. During write, read/write signal 35 is high, and therefore the input to the wordline driver 34 is also high. Accordingly, with the next clock cycle, clock signal 36 goes high, and both wordlines 17, 18 will go active.

FIG. 3 exemplarily shows the decode control from a logical view only. More sophisticated schemes can be devised that are more customized to specific decode schemes (e.g., static decode, dynamic decode).

It is important to mention that the method may apply to all static memory cells (i.e., SRAM or register file cells) that share a true and complement bitline for read and write and that also use a differential write and single-ended read scheme.

Furthermore, it should be noted that the method can be applied to sense-amp schemes as well as to single-ended read schemes as described above. In a single-ended read scheme, a static gate 50 (FIG. 4) connected to one bitline passes a switching on the bitline to the next stage. The details are already described with reference to FIG. 4. The bitline 14 must be discharged by the cell below the switching point of the NAND stage 50 (FIG. 4), which is connected to bitline 14.

In a single-ended sense-amp scheme, the voltage difference between the bitline and a reference voltage is sensed. Thereafter, the bitline must be discharged below the reference voltage.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method for reading and writing at least one static memory cell having a single-ended ripple-domino read scheme, the cell comprising a cross-coupled inverter pair and two pass-devices, one on each side of the cross-coupled inverter pair, wherein for read only one of the two pass-devices is selected, while for write both pass-devices are selected.

2. The method according to claim 1, wherein in order to select only one of the two pass-devices for read and in order to select both pass-devices for write, for each pass-device of the cell an individual wordline is connected with a gate of the particular pass-device, and wherein both wordlines are selected and driven high for write and a single wordline is selected and driven high for read.

3. The method according to claim 2, wherein the wordline selected and driven high for read is the wordline selecting the pass-device connected to a bitline that is used in a single-ended read scheme, and wherein during read the bitline is pulled down if the cell holds a one but no discharge of the bitline occurs if the cell holds a zero.

4. The method according to claim 1, wherein in order to select only one of the two pass-devices for read and in order to select both pass-devices for write, an array read/write signal is used to determine whether the cell is to be accessed in read mode or write mode.

5. The method according to claim 1, wherein the at least one static memory cell has a differential write scheme.

6. A circuit apparatus for reading and writing at least one static memory cell having a single-ended ripple-domino read scheme, the cell comprising a cross-coupled inverter pair and two pass-devices, one on each side of the cross-coupled inverter pair, wherein for each pass-device of the cell an individual wordline is connected with a gate of the particular pass-device, and wherein both wordlines are selected for write and a single wordline is selected for read.

7. The circuit apparatus according to claim 6, further comprising a separate wordline driver for each wordline driving a single cell pass-device or a control feature to select one wordline or both wordlines, depending on whether the cell is to be accessed in read mode or write mode.

8. The circuit apparatus according to claim 7, wherein the separate wordline driver for each wordline driving a single cell pass-device or a control feature is included for at least two cells of a memory array.

9. The circuit apparatus according to claim 6, wherein the control feature uses an array read/write signal, which controls whether the cell is to be accessed in read mode or write mode, in order to select one wordline for read or both wordlines for write.

10. The circuit apparatus according to claim 9, wherein the separate wordline driver for each wordline driving a single cell pass-device or a control feature is included for at least two cells of a memory array.

11. The circuit apparatus according to claim 6, wherein the at least one static memory cell has a differential write scheme.

* * * * *